United States Patent [19]

Naylor et al.

[11] Patent Number: 4,940,981
[45] Date of Patent: Jul. 10, 1990

[54] DUAL ANALOG-TO-DIGITAL CONVERTER WITH SINGLE SUCCESSIVE APPROXIMATION REGISTER

[75] Inventors: Jimmy R. Naylor; Rodney T. Burt; Tony D. Miller, all of Tucson, Ariz.

[73] Assignee: Burr-Brown Corporation, Tucson, Ariz.

[21] Appl. No.: 308,150

[22] Filed: Feb. 8, 1989

[51] Int. Cl.⁵ ............................................. H03M 1/44
[52] U.S. Cl. ................................. 341/161; 341/155; 341/158; 341/136
[58] Field of Search ............... 341/128, 155, 158, 163, 341/161, 172, 136

[56] References Cited

U.S. PATENT DOCUMENTS

| | | | |
|---|---|---|---|
| 3,646,586 | 2/1972 | Kurz | 340/347 |
| 3,982,240 | 9/1976 | Waehner | 341/158 |
| 4,042,885 | 8/1977 | Rhodes, Jr. | 330/9 |
| 4,138,649 | 2/1979 | Schaffer | 330/9 |
| 4,152,659 | 5/1979 | Gordon | 330/9 |
| 4,190,805 | 2/1980 | Bingham | 330/9 |
| 4,229,703 | 10/1980 | Bustin | 328/162 |
| 4,326,192 | 4/1982 | Merrill et al. | 341/172 |
| 4,350,975 | 9/1982 | Haque et al. | 340/347 |
| 4,396,905 | 8/1983 | Chan et al. | 340/347 |
| 4,415,882 | 11/1983 | Akazawa et al. | 340/347 |
| 4,533,877 | 8/1985 | Rahim | 330/253 |
| 4,538,115 | 8/1985 | Butler | 330/253 |
| 4,544,914 | 10/1985 | Chan et al. | 341/155 |
| 4,618,832 | 10/1986 | Schenck | 330/254 |
| 4,620,179 | 10/1986 | Cooper et al. | 340/347 |
| 4,649,372 | 3/1987 | Abe et al. | 341/136 |
| 4,686,507 | 8/1987 | Kessler | 340/347 |
| 4,748,418 | 5/1988 | Kerth | 330/9 |
| 4,749,984 | 6/1988 | Prost et al. | 340/347 |
| 4,761,636 | 8/1988 | Brokaw et al. | 341/134 |
| 4,764,750 | 8/1988 | Kawada | 340/347 |

OTHER PUBLICATIONS

"A Microelectronic Analog to Digital Converter", by R. Calkins, and M. Hickey, 24th Electronic Components Conference, Washington, U.S.A., pp. 274–278, 13–15 May 1974.

Primary Examiner—William M. Shoop, Jr.
Assistant Examiner—Gary J. Romano
Attorney, Agent, or Firm—Cahill, Sutton & Thomas

[57] ABSTRACT

A dual successive approximation analog-to-digital converter, including circuitry for generating separate reference voltages for each analog-to-digital converter, is integrated onto a single semiconductor chip. A single successive approximation register including a 19 bit shift register and two 18 bit latches and associated gating circuitry operates to produce two sets of 18 successive approximation numbers, one supplied as successive digital inputs to a CDAC of one of the analog-to-digital converters and the other set of successive approximation numbers being applied as digital inputs to a CDAC of the other analog-to-digital converter. A CMOS comparator includes two high speed, low gain differential amplifier stages, the first including cascode MOSFETs to provide a high power supply rejection. A pair of auto-zeroing capacitors and a pair of auto-zeroing MOSFETs operate on the outputs of the second differential amplifier to reduce input offset voltage, achieving high speed, low noise operation in a small amount of semiconductor chip area. The auto-zeroed output is supplied to the input of a two stage differential amplifier, the outputs of which also are auto-zeroed and applied to a differential CMOS latch, thereby providing a high speed, low noise, low offset CMOS comparator.

13 Claims, 3 Drawing Sheets

DUAL ANALOG-TO-DIGITAL CONVERTER WITH SINGLE SUCCESSIVE APPROXIMATION REGISTER

CROSS-REFERENCE TO RELATED APPLICATION

This application is related to the co-pending application Ser. No. 308,109, "CMOS VOLTAGE REFERENCE AND BUFFER CIRCUIT", by Timothy V. Kalthoff, filed on even date herewith, assigned to the present Assignee, and incorporated herein by reference.

BACKGROUND OF THE INVENTION

The invention relates to analog-to-digital converters that are useful in digital audio applications, particularly to a monolithic integrated circuit dual analog-to-digital converter that utilizes only a single successive approximation register.

An integrated circuit analog-to-digital converter (ADC) component that is extensively used in digital audio applications such as digital stereo amplifiers, tape recorder/players, and the like is the assignee's model PCM78 16 bit hybrid integrated circuit analog-to-digital converter. The PCM78 is a 16 bit ADC which, in response to an analog audio input signal, produces a continuous stream of serial digital data that very accurately represents the audio input signals. The analog signals can be subsequently accurately reconstructed from the serial digital data. The assignee's PCM78 16 bit analog-to-digital converter is a hybrid integrated circuit that includes two monolithic chips, the first being manufactured using bipolar processing techniques and including a comparator and a voltage reference circuit. (It is necessary to provide very stable, low noise analog reference voltages to implement high accuracy analog-to-digital converters suitable for digital audio applications.) The second chip is manufactured using CMOS technology and includes a successive approximation register and control logic. Users of the PCM78 often use a single PCM78, two external sample and hold circuits (one for the left channel and one for the right channel), and multiplexing circuitry coupling the two sample and hold circuit outputs to a single PCM78. One problem with this circuit configuration is that it can operate at only half the sample rate that could be achieved if two PCM78's are used. The lower sampling rate necessitates the use of more expensive anti-aliasing filters at the inputs of the sample and hold circuits and also results in a lower ADC signal to noise ratio because less averaging of the noise can be achieved. If digital delays in the two sample and hold control circuits are not precisely matched, there will be a timing skew in the desired co-phase sampling of the two audio inputs. For portable applications, the relatively high power consumed by the bipolar portion of the PCM78 can be problematic.

Although the PCM78 has been commercially very successful, there is a need to significantly reduce the cost of its function. At the present time, it is necessary to utilize two such 16 bit ADC's if it is desired to provide separate analog-to-digital conversion functions for both the right audio channel signal and the left audio channel signal in order to make a digital stereo amplifier or the like. Until now no one has attempted to provide two analog-to-digital converters with the 16 bit or greater accuracy that is needed for high fidelity digital audio applications on a single integrated circuit chip, because this would make the chip larger than presently is economically feasible. Although 16 bit ADC accuracy is generally considered adequate for most digital audio applications, there is a market demand for even higher fidelity "digital audio" reproduction. There is a market demand for simultaneous sampling (referred to as co-phase sampling) of right and left channel audio signals prior to analog-to-digital conversion, instead of multiplexing between right and left channels, which has been the usual previous technique.

It would be desirable to be able to use less expensive anti-aliasing filters in a digital audio circuit. This can be achieved if the sampling rate is increased. Prior analog-to-digital circuits have not been able to operate at a sufficiently high oversampling rate to allow much less expensive filtering circuitry to be used. The prior analog-to-digital converters used for digital audio applications generally have been of the successive approximation type.

In some prior systems, two ADC's have been used to allow faster sampling rates so that less expensive anti-aliasing filters can be used. In such systems, the "left channel" ADC and the "right channel" ADC each have included a separate 16 bit analog-to-digital converter with its own successive approximation register (SAR).

Accurate comparators are required in a successive approximation analog-to-digital converter for digital audio applications. The comparators need to operate at high speed, with low noise and low input offset errors. In the past, auto-zeroing techniques have been used to reduce input offset errors in bipolar differential amplifiers and in CMOS differential amplifiers. If auto-zeroing circuitry is used, it usually is connected to the output of the first amplifier stage. It should be appreciated that an object in the design of a high speed, high gain amplifying or pre-amplifying stage of the kind used in a comparator is to achieve precise, high speed operation with minimum noise, and minimum offset. To achieve this, it may be considered desirable to perform an auto-zeroing function at the output of each amplifying stage of the amplifier. This may result in auto-zeroing MOSFETs introducing noise on the output conductors of that stage which, when "referred back" to the inputs, is reduced by the gain of that stage. Various techniques have been used to achieve the benefits of low noise, high speed operation, and low integrated circuit chip area. One approach is to provide a single differential amplifier stage with very high gain, with a source follower output stage and auto-zeroing at its outputs, but this does not result in high speed. Another possible approach is to provide multiple lower gain but higher speed stages and provide auto-zeroing between the various stages, in the hopes of obtaining low noise, high speed operation, but this does not provide low noise. Determining the best approach usually involves difficult design tradeoffs.

It would be desirable to provide an improved FET differential amplifier and/or an improved CMOS comparator that provides lower noise, higher speed, and lower input offset voltage and occupies less chip area than has yet been achieved in the art.

SUMMARY OF THE INVENTION

Accordingly, it is an object of the invention to provide a high accuracy monolithic integrated circuit analog-to-digital converter which allows more precise co-phase sampling than the prior art.

It is another object of the invention to provide a lower cost, more accurate, higher resolution analog-to-digital converter capable of higher sampling rates, better power supply rejection and more precise co-phase sampling, and having a higher signal to noise ratio than prior analog-to-digital converters that have been used in modern digital audio applications.

It is another object of the invention to provide an improved technique for resetting the circuitry of an analog-to-digital converter at the end of each conversion.

It is another object of the invention to provide an inexpensive single chip dual analog-to-digital converter circuit that can use less expensive anti-aliasing filters than analog-to-digital converters previously used for stereo digital audio applications.

It is another object of the invention to provide two successive approximation analog-to-digital converter circuits with at least 18 bit resolution and two separate reference voltage sources on a small single integrated circuit chip, capable of higher sampling rates and having a higher signal to noise ratio than prior analog-to-digital converters that have been used in modern digital audio applications.

It is another object of the invention to provide a low noise, low offset, high speed CMOS differential amplifier.

It is another object of the invention to provide a low noise, low offset, high speed, highly accurate CMOS comparator.

Briefly described, and in accordance with one embodiment thereof, the invention provides a dual successive approximation analog-to-digital converter (ADC) chip including a first N bit CDAC, a second N bit CDAC, a first comparator comparing the output of the first CDAC with a first audio input signal and a second comparator comparing the output of the second CDAC with a second audio input signal, and a dual latch successive approximation register including an N+1 bit shift register, first latching circuitry for generating a first sequence of successive N bit approximation numbers and sequentially applying them to the N digital input conductors of the first N bit CDAC in response to shifting of a logical state through the shift register from an MSB position to an LSB position and a plurality of compare signals produced by the first comparator, and second latching circuitry for generating N successive N bit approximation numbers and sequentially applying them to the N digital input conductors of the second N bit CDAC in response to the shifting of the logical state through the shift register and the compare signals produced by the second comparator. A first commutator circuit serially outputs the ith most significant bit of the ith N bit approximation number of the first means of one of the dual ADC's in response to the i+1th shift of the logical state to the shift register and also includes a second similar N bit commutator for performing the same function for the other ADC including the second CDAC and the second latching circuit.

The dual successive approximation analog-to-digital converter chip is implemented by a CMOS manufacturing process. Separate reference voltages are supplied to the first and second CDACs by a reference circuit that includes a bipolar-CMOS band gap circuit, a CMOS power supply rejection circuit, driving two separate identical unity gain buffer circuits each including a FET amplifier and a CMOS operational transconductance amplifier, resulting in stable, low noise operation that is insensitive to power supply noise. The comparator includes a low gain first FET differential amplifier having cascode FETs coupled between the input FETs and a pair of precision load devices to make differential amplifier gain independent of input common mode voltage. The outputs of the first differential amplifier are connected to the input FETs of a second differential amplifier that has no cascode transistors. The outputs of the second differential amplifier are connected to first and second auto-zeroing capacitors, respectively, the opposite terminals of which are connected to a pair of corresponding auto-zeroing switches. The auto-zeroed outputs are applied to inputs of a two-stage differential amplifier, the outputs of which are auto-zeroed and applied to the inputs of a differential latch.

DESCRIPTION OF THE INVENTION

Figure 1:
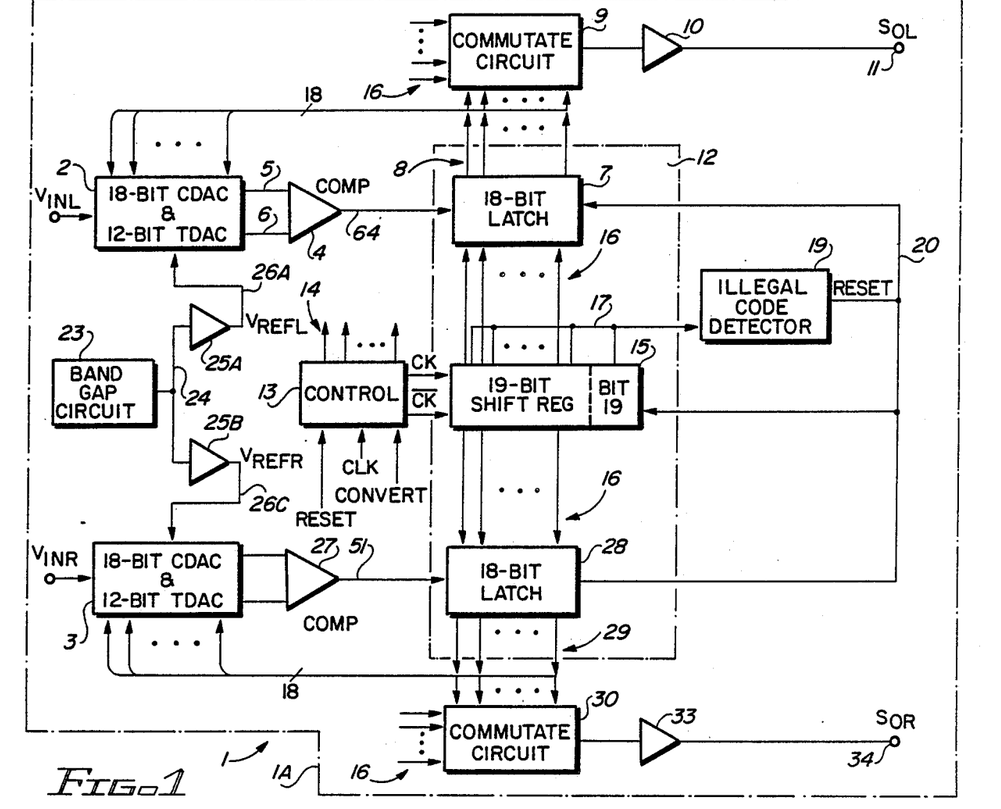
FIG. 1 is a block diagram of the single chip dual analog-to-digital converter of the present invention.

Referring to FIG. 1, monolithic integrated circuit CMOS dual ADC 1 is fabricated on a single CMOS chip designated by dotted line 1A. The described dual ADC chip 1 has an area of approximately 26,000 square mils, or 160 mils square. Dual ADC 1 includes an 18 bit capacitor digital-to-analog converter (CDAC) designated by numeral 2. A 12 bit "trim" digital-to-analog (TDAC) may be included in block 2 to produce an adjustable reference voltage for the comparator 4. The 18 bit CDAC receives a left channel audio signal $V_{INL}$. The output of the 18 bit CDAC in block 2 is connected by conductor 5 to one input of comparator 4. The output of the TDAC in block 2 is connected by conductor 6 to the opposite input of comparator 4. The output of comparator 4 is connected to the D input of each of 18 D type latches of an 18 bit latch circuit 7. The 18 outputs of latch 7 are designated collectively by numeral 8, and are connected to inputs of a commutating circuit 9 and also are respectively fed back to the corresponding digital inputs of the 18 bit CDAC in block 2.

A 19 bit shift register 15 produces 18 parallel outputs, designated collectively by numeral 16, that are connected to the 18 corresponding clock or latching inputs of 18 bit latch 7 and 18 bit latch 28. Shift register 15 also includes a 19th bit. The outputs of each of the 19 bits, collectively designated by numeral 17, are coupled to inputs, respectively, of a 19-input NOR gate, which is part of an illegal code detector circuit designated by numeral 19 in FIG. 1. The output of illegal code detector circuit 19 is connected to a reset conductor 20, which resets 18 bit latch 7, 18 bit latch 28, 19 bit shift register 15, and a control circuit 13.

A right channel audio signal $V_{INR}$ is connected to the input of an 18 bit CDAC designated by numeral 3. Block 3 may also include a 12 bit TDAC (trim DAC) to generate an adjustable reference voltage on one input of comparator 27. The analog output of the CDAC in block 3 is connected to the other input of comparator 27. The output of comparator 27 is connected to the D input of each of 18 D type latches in 18 bit latch circuit 28. The clock or latching inputs of the 18 bit latch circuit 28 are coupled to the outputs of the first 18 bits of register 15. The 18 outputs of latch 28 are connected by 18 output conductors, collectively designated by numeral 29, to the 18 digital inputs, respectively, of CDAC 3. The outputs 29 of 18 bit latch 28 also are connected to the inputs of commutating circuit 30. The output of commutating circuit 9 is connected to the input of a buffer 10, the output 11 of which produces a left channel serial digital output signal $S_{OL}$. Similarly, the output of commutating circuit 30 is coupled by a buffer 33 to conductor 34, on which a right channel serial digital output $S_{OR}$ is produced.

In accordance with the present invention, 19 bit shift register 15 and 18 bit latches 7 and 28 are included in a "dual latch SAR" designated by number 12.

A control circuit 13 generates various control signals 14 in response to a CONVERT signal or command received by the dual ADC 1. The functions of this circuit will be described after the CDAC structure of FIG. 2 is described.

The necessary left channel and right channel reference voltages $V_{REFL}$ and $V_{REFR}$ required by the 18 bit CDACs 2 and 3 are generated on conductor 24 by a band gap circuit 23 and low noise, low output impedance buffer circuits 25A and 25B. The details of band gap circuit 23 and buffer circuits 25A and 25B are shown in the above co-pending Kalthoff application. Buffers 25A and 25B are identical, but both are needed to prevent crosstalk between the left and right channels due to noise caused by the various MOSFET switching operations in each of the CDACs 2 and 3.

Figure 2:
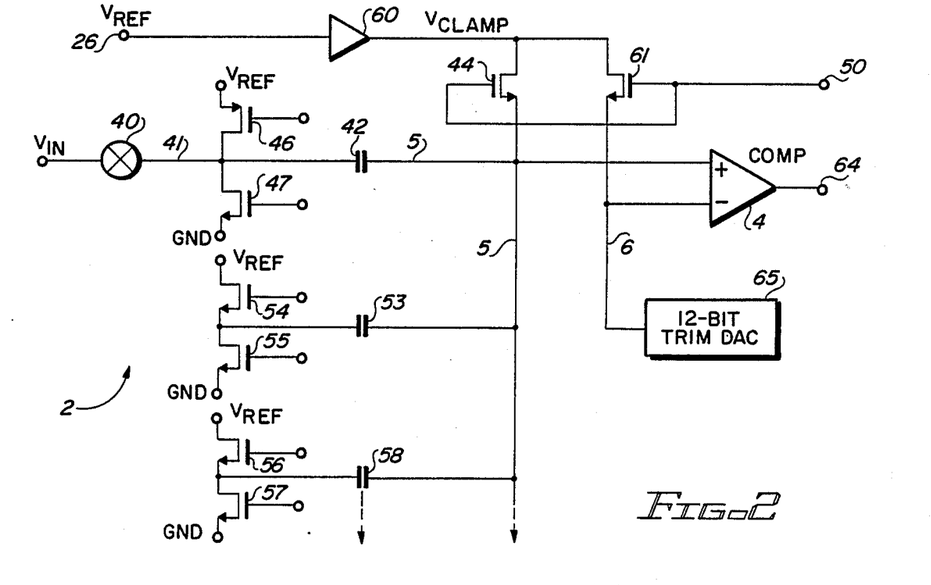
FIG. 2 is a schematic diagram of a CDAC used in the block diagram of FIG. 1.

Referring next to FIG. 2, the basic structure of the CDACs of blocks 2 and 3 is shown. CDACs utilize networks of binarily weighted capacitors that are connected to a charge summing node in order to accomplish binary voltage division in response to digital inputs. FIG. 2 shows three bits of the 18 bit CDAC utilized in blocks 2 and 3. The CDAC includes a voltage reference terminal 26 receiving a reference voltage $V_{REF}$, which is $V_{REFL}$ or $V_{REFR}$. This voltage is input to a clamp circuit 60 that produces a voltage $V_{CLAMP}$. Typically, $V_{REF}$ is approximately 2.75 volts, and $V_{CLAMP}$ is approximately 1.8 volts. The dual ADC circuit 1 operates from power supplies of $+V_{CC}$ equal to $+5$ volts and $-V_{CC}$ equal to $-5$ volts. An N-channel MOSFET 44 connects a charge summing conductor 5 to $V_{CLAMP}$ when a control signal produced by control circuit 13 applies a turn-on voltage to conductor 50, which is connected to the gate of MOSFET 44. Similarly, a turn-on signal applied by conductor 50 to the gate of N-channel MOSFET 61 charges conductor 6 to $V_{CLAMP}$. Charge summing conductor 5 is connected to the non-inverting input of comparator 4, the inverting input of which is connected to conductor 6. Conductor 6 can be connected to a suitable reference voltage, or preferably to the output of trim DAC (TDAC) 65, which is a 12 bit CDAC similar to the 12 most significant bits of CDAC 2 and CDAC 3.

The TDAC 65 allows the reference voltage on conductor 6 to be "adjusted" to compensate for minute, but potentially cumulative variations in the voltage on charge summing conductor 5 caused by charge coupled onto or out of charge summing conductor 5 by various parasitic capacitors during various MOSFET switching operations. TDAC 65 also allows adjustment of the reference voltage on conductor 6 to be adjusted to compensate for ratio mismatches between the various binarily weighted capacitors in the CDAC. Trim DAC 65 is known in the art, and will not be described in detail, except to mention that it switches corresponding binarily weighted capacitors corresponding to the twelve most significant bits of CDAC 2 between a first constant reference voltage and a second trimable adjustable reference voltage that is typically a few millivolts different than the first and is adjustable by laser trimming of nichrome resistors, so that for every ratio mismatch of a CDAC capacitor and/or every undesired parasitic switching of charge into charge summing conductor 5, a corresponding amount of charge is switched into reference conductor 6, so the switching error is eliminated.

Charge summing conductor 5 is connected to 18 binarily weighted capacitors (or an equivalent ladder network), including capacitor 42 for the most significant bit, capacitor 53 for the next most significant bit, capacitor 58 for the next most significant bit, etc. The opposite terminal of each of the binarily weighted capacitors is "pulled up" by a pull-up MOSFET to a reference voltage $V_{REF}$ (which is either $V_{REFL}$ or $V_{REFR}$) and is "pulled down" by one of N-channel pull-down MOSFETs 47, 55, or 57 to a ground voltage GND in response to digital input signals and logical complements thereof that are applied by conductors 8 of latch 7 or conductor 29 of latch 28 of FIG. 1 to the gate electrodes of the pull-up MOSFET and pull-down MOSFET, respectively, for each of the 18 bits. For the MSB, the pullup MOSFET 46 is P-channel, and for the remaining bits pullup MOSFETs such as 54 and 56 are N-channel. The analog input voltage $V_{IN}$ (which is $V_{INL}$ for the CDAC in block 2 and $V_{INR}$ for the CDAC in block 3) is coupled by a CMOS transmission gate 40 to conductor 41. CMOS transmission gate 40 and capacitor 42 cooperate to function as a sample and hold circuit for the most significant bit of CDAC 2.

The digital pattern of the 18 bit input of CDAC 2 determines which of the binarily weighted capacitors, (which all have been previously charged to the reference voltage $V_{REF}$, except for the MSB capacitor, which has been charged to $V_{IN}$) are discharged to ground in response to the 18 bit digital input, thereby coupling a corresponding binarily weighted amount of charge onto charge summing conductor 5. Control circuit 13 of FIG. 1 initiates the sampling operation in response to the signal CONVERT by applying one of control signals 14 to conductor 50 in FIG. 2, turning off MOSFETs 44 and 61. Control circuit 14 also applies another of the control signals 14 to CMOS transmission gate 40 to disconnect $V_{IN}$ from conductor 41 in response to CONVERT. Conductor 41 is connected to the MSB sampling capacitor 42. Control circuit 13, in response to the CONVERT signal, also disables a three state driver circuit (not shown) that drives MOSFETs 46 and 47. The CONVERT signal produces an enable signal that enables the clock signals CK and CK*, which control circuit 13 generates from CLK, to begin clocking the shift register 15, in accordance with usual practice. (Note that an asterisk (*) is used herein to designate logical complement signals, as the word processor being used has no overstrike capability.)

The analog input voltage $V_{IN}$ therefore in effect is compared with the voltage produced on charge summing conductor 5 for each of 18 selected bit patterns produced by the successive approximation register including latch circuits 7 and 28 and shift register 15. If $V_{IN}$ exceeds the voltage on charge summing conductor 5 for the present 18 bit digital input pattern, comparator 4 is switched. The successive approximation operation is performed by generating 18 successive approximation numbers one bit at a time, beginning with the most significant bit, as is well known to those skilled in the art.

For example, for the first iteration of the successive approximation operation, the most significant bit produced by the shift register 15 is output as a "1", with the remaining bits being "0"s. The dual latch SAR 12 then contains a first approximation or "trial" binary number, which lies in the center of the range of possible values of $V_{IN}$. The first digital approximation number is applied to the inputs of both CDAC 2 and CDAC 3. The first iteration is the same for both CDAC 2 and CDAC 3. The following description refers specifically to the subsequent digital approximation numbers applied to CDAC 2. (Operation is entirely analogous for CDAC 3, except that different comparator output data will be produced.) A digital-to-analog conversion is performed by CDAC 2, and the resulting output voltage on charge summing conductor 5 is effectively compared to $V_{IN}$.

If at the end of each trial period for each bit the voltage on charge summing conductor 5 exceeds the voltage produced by TDAC 65 on reference conductor 6, a "high" or "1" output will be produced on conductor 64 by comparator 4. This means that the "1" bit of the present approximation number is "accepted", and is latched into the corresponding bit of latch 7 and then, on the next shift of shift register 15, is serially output by commutating circuit 9 as the present bit of the digital number to which the presently sampled value of $V_{INL}$ is being converted. Conversely, if after the trial or settling period for the present bit, the voltage on charge summing conductor 5 is less than the reference voltage produced by TDAC 65 on conductor 6, a "low" or "0" level is produced on conductor 64 by comparator 4, and is latched into the corresponding bit of latch 7, and then, on the next shift of shift register 15, is serially output by commutating circuit 9 as the next most significant bit of the final digital number to which the presently sampled value of $V_{INL}$ is being converted.

Next, dual latch SAR 12 produces a second digital approximation number in which the most significant bit is either a "0" or a "1", depending upon the last state of comparator output 64, the second most significant bit is a "1", and the remaining bits are "0"s. Then a third approximation number is produced in which the two most significant bits of the desired number are included. The procedure is repeated for the remaining 15 bits, at which point the successive approximation analog-to-digital conversion process is complete. The voltage on charge summing conductor 5 then is almost exactly equal to the voltage on conductor 6.

Figure 3:
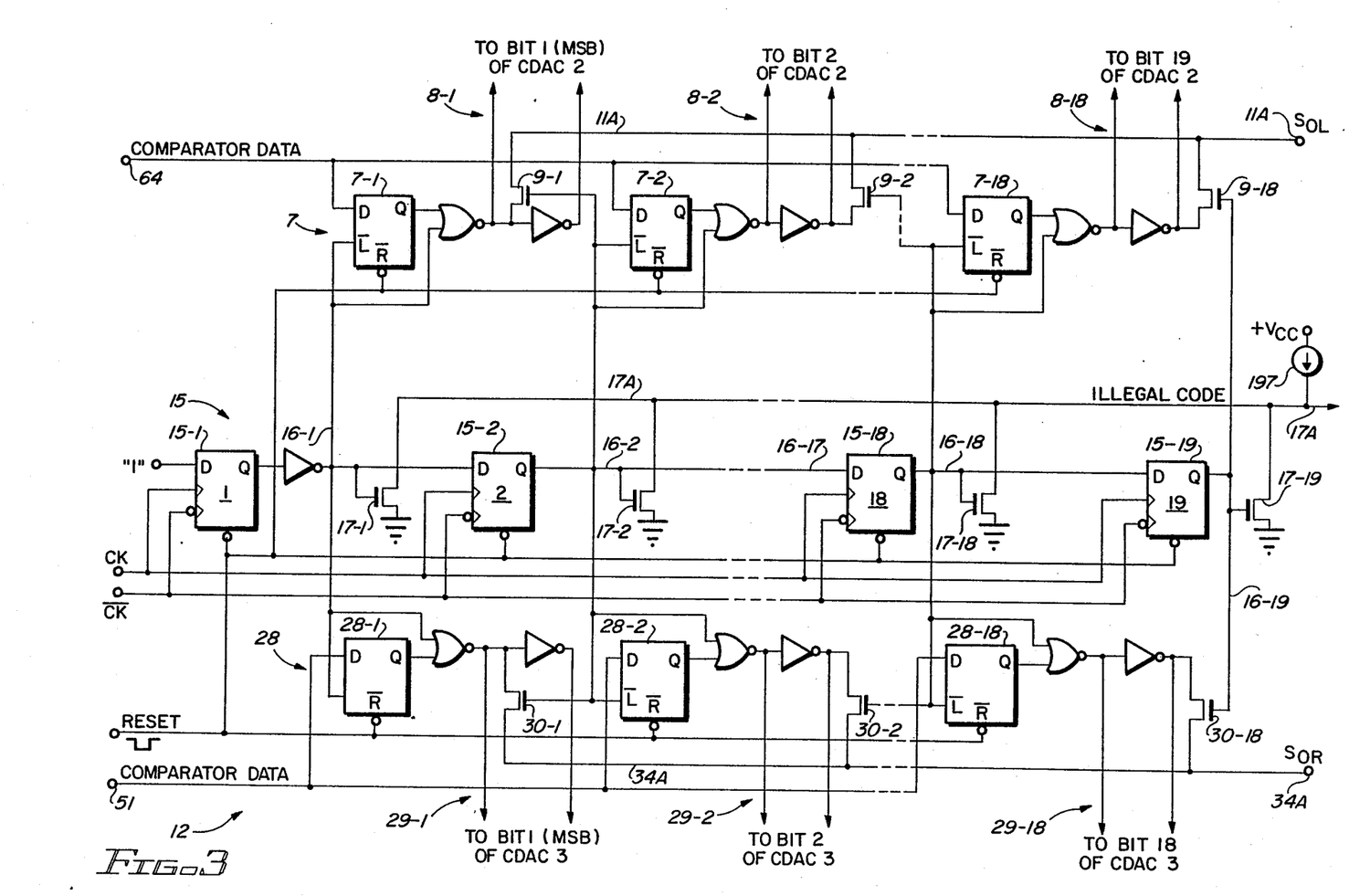
FIG. 3 is a schematic diagram of the successive approximation register in the block diagram of FIG. 1.

FIG. 3 shows the structure of the successive approximation register, which includes 18 bit latch 7, 19 bit shift register 15, and 18 bit latch 28. The basic operation of the shift register 15 (the individual bits of which are designated by numerals 15-1, 15-2, . . . 15-9 in FIG. 3) and latch 7 (the individual bits of which are designated by numeral 7-1, 7-2, . . . 7-18 in FIG. 3) is entirely analogous to the operation described in the present assignee's U.S Pat. No. 4,777,470 (Naylor et al.), issued Oct. 11, 1988, entitled "HIGH SPEED SUCCESSIVE APPROXIMATION REGISTER IN ANALOG-TO-DIGITAL CONVERTER", incorporated herein by reference. The dual latch SAR 12 in FIGS. 1 and 3 further includes a second latch 28, the individual bits of which are designated by numerals 28-1, 28-2, . . . 28-18.

Each master/slave shift register bit 15-1, 15-2, etc. produces an output that drives the latch (L*) input of the latch element of both latches 7 and 28.

Commutator circuit 9 includes N-channel MOSFET 9-1, the source of which is connected to the output of the NOR gate of bit 1, and MOSFETs 9-2, . . . 9-18, the sources of which are all connected to the outputs of the corresponding inverters, respectively, as shown. The drains of MOSFETs 9-1, 9-2, . . . 9-18 are connected to conductor 11A, which produces the serial output signal $S_{OL}$. Similarly, commutating circuit 30 includes N-channel MOSFET 30-1, the source of which is connected to the output of the 2-input NOR gate of the MSB, and MOSFETs 30-2, . . . 30-18 the sources of which are connected to the outputs of the corresponding inverters, respectively, as shown. The drains of the commutator MOSFETs 30-1, 30-2, . . . 30-18 are connected to conductor 34A, on which the serial output signal $S_{OR}$ is produced. The inverters connected to the outputs of the various NOR gates produce complementary bit signals for each bit of CDAC 2, as indicated by complementary conductor pairs 8-1, 8-2, . . . 8-18. Similarly, the inverters connected to the outputs of the two input NOR gates in latch circuit 28 generate complementary bit signals to the individual bits of CDAC 3, as indicated by complementary signal pairs 29-1, 29-2, . . . 29-18.

N-channel MOSFETs 17-1, 17-2, . . . 17-19 each have a gate coupled to an output of one of the master/slave latch bits of shift register 15, which outputs are designated by numerals 17-1, 17-2, . . . 17-19. The sources of MOSFETs 16-1, 16-2, . . . 16-19 are connected to ground, and their drains are connected to conductor 17A, which is connected to a pullup load device 197 and produces a signal ILLEGAL CODE that causes the signal RESET to be produced on conductor 20 of FIG. 1.

The commutating latch circuit 9 serially outputs the bits produced by the dual latch SAR 12 in the order in which they are produced, starting with the MSBs. Each successive approximation number produced for each bit of the dual latch SAR 12 has one more correct, next-most-significant bit than the previous successive approximation number, and the next shift of the "1" in shift register 15 causes commutating circuit 9 to gate that next-most-significant bit out of latch 7 via buffer 10 to $S_{OL}$ conductor 11. Commutating circuit 30 operates entirely similarly to commutating circuit 9, to serially output bits produced by the latch 28 of dual latch SAR 12 via buffer 33 to $S_{OR}$ conductor 34, respectively.

Figure 4:
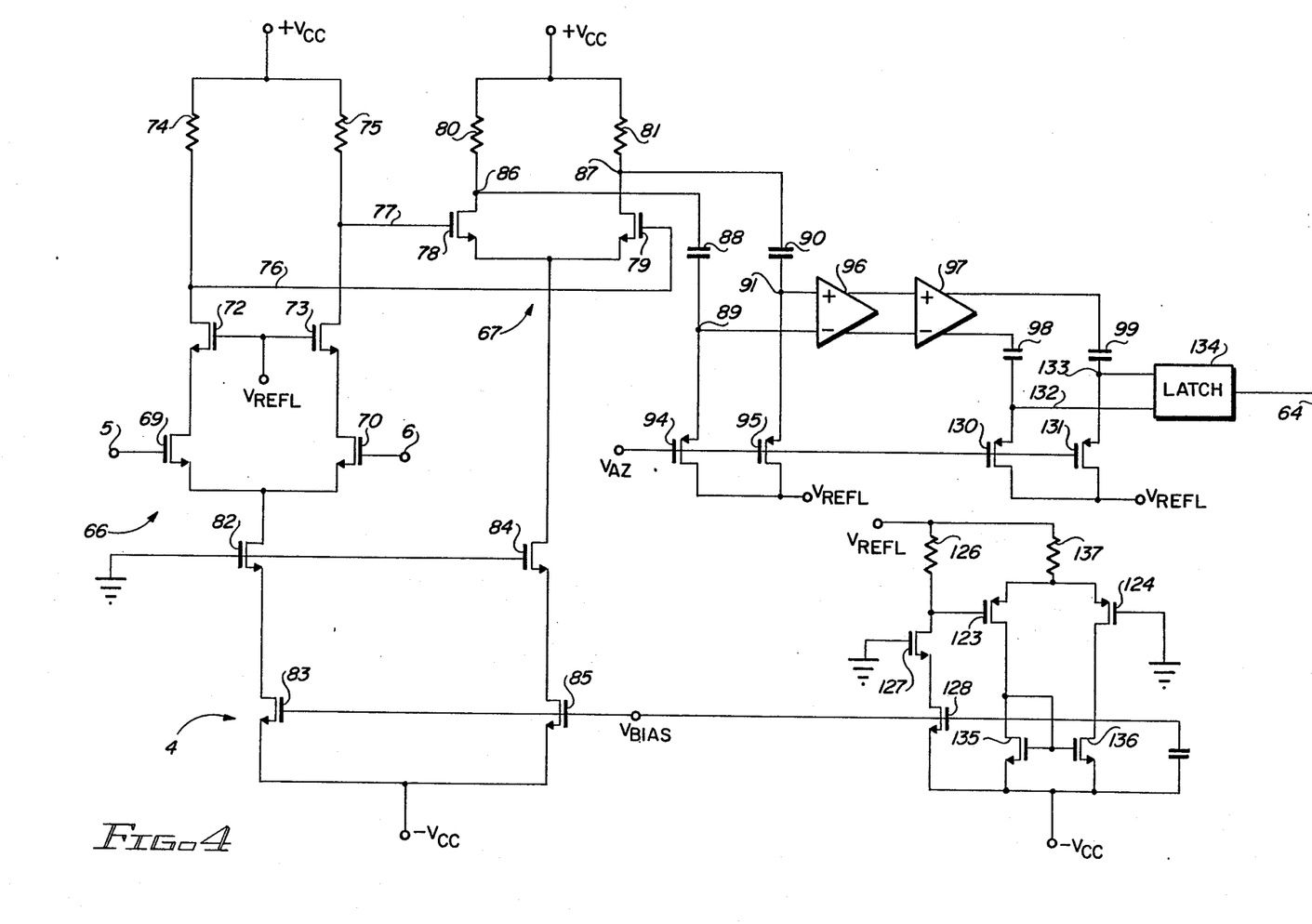
FIG. 4 is a schematic diagram of a comparator used in the block diagram of FIG. 1.

Referring to FIG. 4, which shows the details of comparator 4 (which is identical to comparator 27), its inputs 5 and 6 receive the outputs of CDAC 2 and the compensating reference voltage produced by trim DAC 65, respectively. The first stage 66 of comparator 4 is a differential amplifier stage including N channel input MOSFETs 69 and 70, the sources of which are connected to the drain of N channel "cascode" MOSFET 82. The gates of MOSFETs 69 and 70 are connected to conductors 5 and 6, respectively. Their drains are connected to the sources of "cascode" N channel MOSFETs 72 and 73. The gates of cascode MOSFETs 72 and 73 are connected to a reference voltage $V_{REFL}$. The drains of cascode MOSFETs are connected by conductors 76 and 77 to the lower terminals of high precision nichrome resistors 74 and 75. The upper terminals of resistors 74 and 75 are connected to $+V_{CC}$. The source of cascode MOSFET 82 is connected to the drain of an N-channel current mirror MOSFET 83, the source of which is connected to $-V_{CC}$. The gate of cascode MOSFET 82 is connected to ground.

Conductors 76 and 77 are connected to the gates of input N channel MOSFETs 78 and 79 of a second differential amplifier stage 67 of comparator 4. The sources of MOSFETs 78 and 79 are connected to the drain of N channel cascode MOSFET 84. The gate of cascode MOSFET 84 is connected to ground. The source of cascode MOSFET 84 is connected to the drain of N channel current mirror MOSFET 85, the source of which is connected to $-V_{CC}$. The gates of current mirror MOSFETs 83 and 85 are connected to a current mirror control circuit which generates $V_{BIAS}$.

The drains of N channel input MOSFETs 78 and 79 of differential amplifier 67 are connected by conductors 86 and 87 to the lower terminals of high precision nichrome load resistors 80 and 81, the upper terminals of which are connected to $+V_{CC}$. Conductors 86 and 87 are connected to the upper terminals of auto-zeroing capacitors 88 and 90, respectively. The lower terminals of auto-zeroing conductors 88 and 90 are connected by conductors 89 and 91 to the sources of P-channel auto-zeroing MOSFETs 94 and 95, respectively. (The auto-zeroing MOSFETs could be N-channel.) The drains of MOSFETs 94 and 95 are connected to $V_{REFL}$. The gates of MOSFETs 94 and 95 are connected to an auto-zeroing signal $V_{AZ}$.

Output conductors 89 and 91 of differential amplifier 67 are connected to the inverting and non-inverting inputs, respectively, of a third differential amplifier 96, which can be essentially similar to differential amplifier 67. The inverted and non-inverted outputs of differential amplifier 96 are connected to the inverting and non-inverting inputs of a fourth differential amplifier 97, which can also be essentially identical to differential amplifier 67. The inverted output of differential amplifier 97 is connected to the upper terminal of auto-zeroing capacitor 98, and the non-inverted output of differential amplifier 97 is connected to the upper terminal of auto-zeroing capacitor 99. The lower terminals of capacitors 98 and 99 are connected by conductors 132 and 133 to the sources of P channel auto-zeroing transistors 130 and 131, respectively. The drains of auto-zeroing transistors 130 and 131 are connected to $V_{REFL}$, and their gates are connected to the auto-zeroing signal $V_{AZ}$. Conductors 132 and 133 are connected to the differential inputs of a conventional CMOS differential latch circuit 134, which can be easily implemented by one skilled in the art, and therefore is not shown. The output of latch 134 is connected to comparator output conductor 64.

In FIG. 4, $V_{BIAS}$ is produced by a circuit including a current mirror control circuit with P-channel MOSFETs 123 and 124 having their sources connected by resistor 137 to $V_{REFL}$. The drain of MOSFET 124 is connected to the $V_{BIAS}$ conductor and the drain of N channel MOSFET 136, the source of which is connected to $-V_{CC}$. The drain of MOSFET 123 is connected to the drain and gate of N-channel MOSFET 135, the source of which is connected to $-V_{CC}$. The gate of MOSFET 136 is connected to the gate of MOSFET 135. The $V_{BIAS}$ conductor also is connected to the gate of an N channel MOSFET 128, the source of which is connected to $-V_{CC}$. The drain of MOSFET 128 is connected to the source of N channel MOSFET 127, the gate of which is connected to ground. The drain of MOSFET 127 is connected to the gate of MOSFET 123 and to the lower terminal of precision nichrome resistor 126, the upper terminal of which is connected to $V_{REFL}$. The gate of MOSFET 124 is connected to ground.

The current mirror output transistors such as 83 and 85, and also the current mirror transistors of differential amplifiers 96 and 97, are scaled to current mirror transistor 128. The currents flowing through resistor 126, and hence through MOSFET 128, precisely control the current flowing through current mirror transistors 83 and 85. The voltage across resistor 126 is constant and is precisely proportional to the voltages across load resistors 74, 75, 80, and 81 of differential amplifiers 66 and 67.

The values of resistors 74 and 75 can be 1.2 kilohms. The resistances of resistors 80 and 81 can be 4.8 kilohms. The resistance of resistor 126 can be 5.5 kilohms, and the resistance of resistor 137 can be 2 kilohms.

For those resistor values, the gain of the first stage 66 is approximately 8, and the gain of the second stage 67 is approximately 6. The gains of stages 96 and 97 can be 8 and 6, respectively, providing a total gain from the input to the output of the four stage amplifier of approximately 2300. (Latch 134 provides substantial additional gain.)

By providing the gain of only approximately 8 in differential amplifier 66, very high speed is achieved for that stage. The outputs of stage 66 are connected directly to the inputs of stage 67. Cascode MOSFETs 72 and 73 prevent power supply variations of $+V_{CC}$ from altering the gate to source voltages of transistors 69 and 70, to a great extent preserving a good power supply rejection ratio.

The second stage 67 has a similar gain of approximately 6. By providing constant currents through current source transistors 85 and 83 that are precisely ratioed to each other and are proportional to the voltage across precision resistor 126, a known constant voltage is developed across resistors 74, 75, 80 and 81. Thus, a constant drain-to-source voltage is established across MOSFETs 78 and 79. Good common-mode rejection and power supply rejection is thereby obtained for stage 67 without the use of noisy level-shifting source followers between conductors 76 and 77 and the gates of MOSFETs 78 and 79.

The outputs 86 and 87 of stage 67 are auto-zeroed by turning on P-channel MOSFETs 94 and 95 (with the voltages on conductors 5 and 6 forced to equal voltages) before applying a differential input voltage therebetween, so that any input offset voltage due to mismatching of MOSFETs 69 and 70, mismatching of MOSFETs 78 and 79, and mismatching of resistors 74 and 75, and mismatching of resistors 80 and 81 is stored on the auto-zeroing capacitors 88 and 90. Auto-zeroing MOSFETs 94 and 95 then are turned off, and a differential voltage applied between input conductors 5 and 6 is amplified and applied to the input of stage 96.

Noise introduced by auto-zeroing transistors 94 and 95, when referred back to the inputs 5 and 6, is divided by the combined gain of both stages 66 and 67, rather than only stage 66. No additional noise due to buffering between stages 66 and 67 has been introduced. It has been found that high speed performance is achieved than if the same function is implemented by a single high gain stage with source follower outputs that are auto-zeroed.

It should be appreciated that the simple expedient of providing the auto-zeroing function only at the output of a high gain amplifier is impractical, because if mismatches in the input transistors due to normal processing parameter tolerances are such that an input offset, when multiplied by the total gain of the circuit, exceeds the power supply values or would cause circuit operation out of its linear region, then this approach is impractical. As a practical matter, for a circuit with $+V_{CC}$ of $+5$ volts, an input offset voltage of ten millivolts multiplied by a gain of 500 would exceed the worst case power supply voltage.

It is necessary to make a very delicate tradeoff between circuit speed, effect of loading on bandwidth, circuit area occupied on the IC chip, noise referred back to the input, power, and speed in order to arrive at an optimum differential amplifier design. It was found that using the above described two stage design, with each stage having relatively low gain, and auto-zeroing the output of the second stage resulted in substantially less chip area and better overall performance than using a single high gain stage, followed by a source follower output.

In accordance with the present invention, provision of a single SAR (successive approximation register), including 19 bit register 15 and 18 bit latches 7 and 28 in FIG. 1 for two successive approximation analog-to-digital converters, using CDAC structures, with accuracy of 16 bits or greater on a single monolithic chip results in numerous advantages. Use of the CDAC structures results in simple implementation of the sample and hold function. Implementation of the entire circuit in CMOS technology results in much lower power dissipation than any previous dual ADC systems, which required each separate ADC to be implemented on a different integrated circuit chip. The high speed of operation needed to accomplish co-phase sampling and a high rate of over-sampling in order to obtain a high signal-to-noise ratio is achieved. The above described dual ADC chip operates at 192 kilohertz, which is four times the Nyquist sampling rate for audio frequency input signals for the 22 kilohertz audio bandwidth used for digital audio applications. The low noise level achieved by the high over-sampling rate allows use of a simpler, anti-aliasing filter that is far less expensive than the 10-to-12 pole anti-aliasing filters usually required in alternate-sampled stereo digital audio applications. The above-described dual CDAC, single SAR structure allows simple implementation of co-phase or simultaneous sampling at twice the rate possible with alternate sampling, at no additional cost. Signal delays through the dual ADCs, the SAR and the central logic are precisely matched due to the monolithic integration of all components, resulting in more precise timing of the co-phase sampling of both the left and right audio channels than, as a practical matter, has been previously achievable. The overall result is a high speed, low cost, very precise dual channel ADC with 18 bit resolution, high signal-to-noise ratio, and low total harmonic distortion.

In accordance with another aspect of the invention, the illegal code detector 19 is capable of detecting any condition in which all 19 bits of shift register 15 are equal to zero and generating a reset signal. The illegal code detector circuit 19, although separately shown as a separate block in FIG. 1, includes all 19 N-channel MOSFETs 17-1, 17-2, ... 17-19 of FIG. 3 and pullup load device 197, which constitute a NOR gate that produces an ILLEGAL CODE signal when all of the 19 bits are "0"s. This generates the signal RESET which is used to eliminate the effect of any illegal states that may occur during circuit power up or during a later power supply fluctuation. When the "1" that propagates through 19 bit shift register to effectuate the above described sequence of successive approximations applied to the digital inputs of CDACs 2 and 3 is shifted out of bit 19, it means that the conversion and commutating process is complete. This final shift produces 19 zeros in shift register 15, causing the NOR gate to immediately generate the signal RESET on conductor 20. This allows enough time for settling of voltages induced in the integrated circuit substrate as a result of simultaneous discharge of various capacitive nodes of the circuit into the substrate in response to the reset signal. That prevents deterioration of the sampled voltage on capacitor 42 that might otherwise occur.

While the invention has been described with reference to a particular embodiment thereof, those skilled in the art will be able to make various modifications to the described embodiment without departing from the true spirit and scope of the invention. For example, some bits of the CDACs might be composed of conventional binarily weighted resistive circuits, rather than capacitor circuits. The logical "0" and "1" definitions are, of course, arbitrary and can be altered by those skilled in the art.

What is claimed is:

1. A dual channel successive approximation analog-to-digital converter chip for converting first and second analog input signals to first and second digital numbers, respectively, comprising in combination:
   (a) a semiconductor chip;
   (b) a first N bit CDAC on the chip including N digital input conductors, a first analog output conductor, and means for combining the first analog input signal with an analog output signal produced by the first N bit CDAC to produce a first combined signal on the first analog output conductor;
   (c) a second N bit CDAC on the chip including N digital input conductors, a second analog output conductor, and means for combining the second analog input signal with an analog output signal produced by the second bit CDAC to produce a second combined analog signal on the second analog output conductor;
   (d) a first comparator on the chip having a first input conductor coupled to the first analog output conductor, and a second input conductor receiving a first reference voltage;
   (e) a second comparator on the chip having a first input conductor coupled to the second analog output conductor, and a second input conductor receiving a second reference voltage;
   (f) a successive approximation register on the chip including:
      i. a shift register including N bits each having an output conductor,
      ii. first means coupled to an output conductor of the first comparator and the output conductors of the N bits of the shift register for generating a first sequence of successive N bit approximation numbers and sequentially applying them to the N digital input conductors of the first N bit CDAC in response to shifting of a logical state through the shift register from an MSB position to an LSB position thereof and in response to a plurality of compare signals produced by the first comparator, respectively, iii. second means coupled to an output conductor of the second comparator and the output conductor of the N bits of the shift register for generating a second sequence of N successive N bit approximation numbers and sequentially applying them to the N digital input conductors of the second N bit CDAC in response to the shifting of the logical state through the shift register from the MSB position to the LSB position and in response to a plurality of compare signals produced by the second comparator, respectively, the first N bit CDAC, the shift register, the first means, and the first comparator forming a part of a first analog-to-digital converter, and the second N bit CDAC, the shift register, the second means, and the second comparator forming a part of a second analog-to-digital converter.

2. The dual successive approximation analog-to-digital converter chip of claim 1 wherein the shift register includes N+1 bits, the dual successive approximation analog-to-digital converter chip including first N bit commutating means for serially outputting the ith most significant bit of the ith N bit approximation number generated by the first means in response to the i+1th shift of the logical state through the shift register and second N bit commutating means for serially outputting the ith most significant bit of the ith N bit approximation number generated by the second means in response to the i+1th shift of the logical state through the shift register, where i is an integer having any value between 1 and N.

3. The dual successive approximation analog-to-digital converter chip of claim 2 including first and second sample and hold means in the first and second N bit CDACs, respectively, for simultaneously sampling and holding the first and second analog input signals, respectively.

4. The dual successive approximation analog-to-digital converter chip of claim 3 wherein the first sample and hold means includes a first capacitor in the first N bit CDAC and a first field effect transistor coupled between the first capacitor and a conductor carrying the first analog input signal, and the second sample and hold means includes a second capacitor in the second N bit CDAC and a second field effect transistor coupled between the second capacitor and a conductor carrying the second analog input signal.

5. The dual successive approximation analog-to-digital converter chip of claim 4 wherein the first and second comparators and the successive approximation register are integrated circuit field effect transistor circuits.

6. The dual successive approximation analog-to-digital converter chip of claim 5 wherein a first bit of the shift register is in the MSB position and a Nth bit of the shift register is in the LSB position, the chip including error detecting means for detecting an illegal condition consisting of all N+1 bits of the shift register having the same state and means for resetting the first and second N bit CDACs and the successive approximation register in response to the illegal condition.

7. The dual successive approximation analog-to-digital converter of claim 6 including a band gap circuit for generating a band gap voltage and first and second low output impedance buffers generating separate reference voltages in response to the band gap voltage and applying them to the first and second N bit CDAC's, respectively.

8. The dual successive approximation analog-to-digital converter of claim 2 wherein N is equal to at least 16.

9. The dual successive approximation analog-to-digital converter of claim 8 wherein N is equal to 18.

10. The dual successive approximation analog-to-digital converter of claim 9 including means for simultaneously sampling the first and second analog input signal at approximately 190 kilohertz.

11. The dual successive approximation analog-to-digital converter of claim 1 wherein the first comparator includes a field effect transistor differential amplifier having first and second input terminals coupled to the first and second input conductors, respectively, and including i. a first stage including first and second input field effect transistors with gates coupled to the first and second input terminals, respectively, a first current source supplying a first constant current to sources of the first and second field effect transistors, and first and second load devices coupled by first and second conductors to drains of the first and second field effect transistors, respectively, ii. a second stage including third and fourth input field effect transistors having gates coupled to the first and second conductors, respectively, a second current source supplying a second constant current to sources of the third and fourth field effect transistors, and third and fourth load devices coupled by third and fourth conductors to drains of the third and fourth field effect transistors, respectively, iii. a first capacitor having a first terminal coupled to the third conductor and a second terminal coupled to a fifth conductor, and a second capacitor having a first terminal coupled to the fourth conductor and a second terminal coupled to a sixth conductor;

iv. a first auto-zeroing field effect transistor coupled between the fifth conductor and a second reference voltage conductor, and a second auto-zeroing field effect transistor coupled between the sixth conductor and the second reference voltage conductor, v. means for turning the first and second auto-zeroing field effect transistors on to allow an output offset voltage to be developed across the first and second capacitors.

12. A method of converting first and second audio signals to first and second digital numbers with N bit resolution and N bit accuracy on a single integrated circuit chip, comprising the steps of:

(a) fabricating first and second CDACs each including N bits, first and second comparators, and a dual latch successive approximation register including a single shift register on the chip using a CMOS fabrication process;

(b) resetting the first and second latches and the shift register and loading a "1" into an MSB of the shift register;

(c) applying N outputs of the first latch to N digital inputs of the first CDAC, respectively, and applying N outputs of the second latch to N digital inputs of the second CDAC, respectively;

(d) applying each output of the shift register to both a corresponding input of the first latch and a corresponding input of the second latch;

(e) simultaneously i. sampling a first signal level of the first audio signal and holding it as a first sampled signal level in the first CDAC in response to a convert signal and ii. sampling a second signal level of the second audio signal and holding it as a second sampled signal level in the second CDAC in response to the convert signal;

(f) combining the first sampled signal level with a conversion signal level produced in the first CDAC, in response to the contents of the first latch and the convert signal, to thereby produce a first combined signal, and combining the second sampled signal level with a second conversion signal level produced in the second CDAC, in response to the contents of the second latch and the convert signal, to thereby produce a second combined signal;

(g) producing a first comparator data signal which is a "1" if the first combined signal exceeds a threshold signal and otherwise is a "0" at the output of the first comparator and producing a second comparator data signal which is a "1" if the second combined signal exceeds the threshold signal and otherwise is at the second logical level at the output of the second comparator;

(h) shifting the "1" into the next-most-significant bit of the shift register;

(i) entering the first and second comparator data into a bit of the first latch and into a bit of the second latch, respectively, that correspond to a bit of the shift register from which the "1" is shifted in step (h);

(j) serially outputting the first comparator data from the bit of the first latch that corresponds to a bit of the shift register from which the "1" is shifted in step (h) and serially outputting the second comparator data from the bit of the second latch that corresponds to a bit of the shift register from which the "1" is shifted in step (h).

13. A method of converting first and second analog signals to first and second digital numbers with N bit resolution and N bit accuracy on a single integrated circuit chip, comprising the steps of:

(a) fabricating first and second CDACs each including N bits, first and second comparators, and a dual latch successive approximation register including a single shift register on the chip;

(b) resetting the first and second latches and the shift register to "0"s and loading a "1" into an MSB of the shift register;

(c) applying N outputs of the first latch to N digital inputs of the first CDAC, respectively, and applying N outputs of the second latch to N digital inputs of the second CDAC, respectively;

(d) applying each output of the shift register to both a corresponding input of the first latch and a corresponding input of the second latch;

(e) sampling a first signal level of the first analog signal and holding it as a first sampled signal level in the first CDAC in response to a convert signal and sampling a second signal level of the second analog signal and holding it as a second sampled signal level in the second CDAC in response to the convert signal;

(f) combining the first sampled signal level with a first conversion signal level produced in the first CDAC, in response to the contents of the first latch and the convert signal, to thereby produce a first combined signal, and combining the second sampled signal level with a second conversion signal level produced in the second CDAC, in response to the contents of the second latch and the convert signal, to thereby produce a second combined signal;

(g) producing a first comparator data signal which is a "1" if the first combined signal exceeds a threshold signal and otherwise is a "0" at the output of the first comparator and producing a second comparator data signal which is a "1" if the second combined signal exceeds the threshold signal and otherwise is at the second logical level at the output of the second comparator;

(h) shifting the "1" into the next-most-significant bit of the shift register;

(i) entering the first and second comparator data into a bit of the first latch and into a bit of the second latch, respectively, that correspond to a bit of the shift register from which the "1" is shifted in step (h);

(j) serially outputting the first comparator data from the bit of the first latch that corresponds to a bit of the shift register from which the "1" is shifted in step (h) and serially outputting the second comparator data from the bit of the second latch that corresponds to a bit of the shift register from which the "1" is shifted in step (h).

* * * * *